United States Patent [19]
Fukiharu

US006150748A
[11] Patent Number: 6,150,748
[45] Date of Patent: Nov. 21, 2000

[54] SURFACE-ACOUSTIC-WAVE DEVICE

[75] Inventor: Eiichi Fukiharu, Tokyo, Japan

[73] Assignee: NEC Corporation, Tokyo, Japan

[21] Appl. No.: 09/241,015

[22] Filed: Feb. 1, 1999

[30] Foreign Application Priority Data

Feb. 20, 1998 [JP] Japan .................................. 10-054127

[51] Int. Cl.⁷ .................................................. H03H 9/25
[52] U.S. Cl. ..................... 310/313 R; 310/340; 310/344; 310/348
[58] Field of Search ............................... 310/313 R, 340, 310/344, 348

[56] References Cited

U.S. PATENT DOCUMENTS

| | | | |
|---|---|---|---|
| 5,459,368 | 10/1995 | Onishi et al. | 310/313 R |
| 5,699,027 | 12/1997 | Tsuji et al. | 333/193 |
| 5,712,523 | 1/1998 | Nakashima et al. | 310/313 R |
| 5,818,145 | 10/1998 | Fukiharu | 310/313 R |
| 5,821,665 | 10/1998 | Onishi et al. | 310/313 R |
| 5,939,817 | 8/1999 | Takado | 310/348 |
| 5,991,989 | 11/1999 | Onishi et al. | 29/25.35 |
| 6,033,852 | 3/2000 | Andle et al. | 435/6 |

FOREIGN PATENT DOCUMENTS

| | | | |
|---|---|---|---|
| 637 871 A1 | 2/1995 | European Pat. Off. | H03H 9/05 |
| 840 369 A1 | 5/1998 | European Pat. Off. | H01L 21/56 |
| 896 427 A2 | 2/1999 | European Pat. Off. | H03H 9/05 |
| 60-1999298 | 10/1985 | Japan | 310/348 |
| 61-202508 | 9/1986 | Japan | 310/348 |
| 3-173216 | 7/1991 | Japan | 310/313 R |

*Primary Examiner*—Thomas M. Dougherty
*Attorney, Agent, or Firm*—Scully, Scott, Murphy & Presser

[57] ABSTRACT

The surface-acoustic-wave device has surface-acoustic-wave element 1 provided with interdigital electrodes 2, shut-off member 32 and ground patterns 35-1, 35-2. Interdigital electrodes 2 are formed on a first surface of surface-acoustic-wave element 1 and covered with protective film 33. Surface-acoustic-wave element 1 is mechanically supported above mounting substrate 36. Shut-off member 32 serves to shut off surface-acoustic-wave element 1 electrically and airtightly from an ambience. The ground patterns 35-1, 35-2, grounded electrically, serve to discharge an electric charge. Ground patterns 35-1, 35-2 contact a surface of mounting substrate 36. Shut-off member 32 covers surface-acoustic-wave element 1 and also is connected with ground patterns 35-1, 35-2 that are in contact with the surface of mounting substrate 36.

8 Claims, 4 Drawing Sheets

SURFACE-ACOUSTIC-WAVE DEVICE

BACKGROUND OF THE INVENTION

1. Field of the Invention

The present invention relates to a surface-acoustic-wave device (hereinafter, referred to as a SAW device). In particular, the present invention relates to a SAW device having a SAW element on which interdigital electrodes are formed and which is covered with a conductive thin-film to shield the SAW element against an external electric field.

2. Description of the Related Art

FIG. 1 represents an example of construction of a SAW device currently in use.

Interdigital electrodes 2 and I/O (input/output) electrodes 3-1, 3-2 are formed of aluminum (Al) thin films on one surface of a SAW element 1. SAW element 1 is formed on ceramic substrate 11 with interposition of ground pattern 8. I/O terminals 10-1 and 10-2 are formed on ceramic substrate 11.

I/O electrode 4-1 is connected with I/O terminal 10-1 via through-hole 9-1. Similarly, I/O electrode 4-2 is connected with I/O terminal 10-2 via through-hole 9-2.

I/O electrodes 3-1, 3-2 formed on the surface of SAW element 1, on which interdigital electrodes 2 are formed, are connected with I/O electrode 4-1, 4-2 by bonding wire 5-2, 5-2, respectively.

Seam-ring 6 and metal cover 7 define a space above the surface on which interdigital electrodes of the SAW device are formed.

FIG. 2 shows another example of a SAW device in which metal bumps 21-1, 21-2 are employed to perform an electric I/O between SAW element 1 and an external circuit.

In the SAW device shown in FIG. 2, interdigital electrodes 2 and I/O electrodes 3-1, 3-2 are formed on one surface (a first surface) of SAW element 1. The I/O electrode 3-1 of SAW element 1 is connected with I/O electrode 4-1 through metal bump 21-1. I/O electrode 4-1 is formed on the surface of ceramic substrate 11. Similarly, the I/O electrode 3-2 is connected with I/O electrode 4-2, formed on the surface of ceramic substrate 11, through metal bump 21-2.

A ground pattern 8 is formed on one of the surfaces of ceramic substrate 11 where I/O electrodes 4-1, 4-2 are provided. I/O terminals 10-1, 10-2 are formed on the opposite surface of the substrate.

I/O terminal 10-1 and I/O electrode 4-1 are connected through through-hole 9-1, and, similarly, I/O terminal 10-2 and I/O electrode 4-2 are connected through through-hole 9-2.

In this configuration of the device, SAW element 1 is surrounded with seam-ring 6 and metal cover 7.

Either of the SAW devices shown in FIG. 1 and FIG. 2, however, requires an electric-shield chamber made up of ceramic substrate 11, seam-ring 6, metal cover 7, etc. to shield SAW element 1, interdigital electrodes and I/O electrodes 3-1, 3-2 against external electric field.

A problem has been that this requirement of the electric-shield chamber entails high cost for the SAW device. Another problem has been that provision of the electric-shield chamber causes to increase the volume of the SAW device for mounting the SAW element.

Many electric companies have investigated methods of mounting a SAW element directly on a mounting substrate.

This mounting method includes a problem concerning the way of preventing an erosion of an Al pattern formed on a surface of a SAW element (the pattern of the interdigital electrodes). The method includes another problem to be taken into account concerning the way of electric-shielding of the SAW element against an external electric field neither giving rise to a high cost nor enlarging the volume of the SAW device.

In order to solve the former problem, it is advantageous to apply a protective layer (for example $SiO_2$) on the Al pattern or to place the Al pattern in an airtight arrangement.

Concerning the latter problem, however, no effective method has been currently found.

SUMMARY OF THE INVENTION

The present invention has been made under above-described circumstances.

It is an object of the present invention to provide a SAW device of a low cost and a simple construction, capable of electrically shielding the SAW element against an external electric field while designed to have a small volume.

In order to attain the above-described object of the present invention, a first surface-acoustic-wave device (a first SAW device) has a surface-acoustic-wave element provided with interdigital electrodes, a shut-off member and ground patterns. The SAW device is mounted on a mounting substrate.

The interdigital electrodes are formed on a first surface of the surface-acoustic-wave element. The shut-off member serves to shut off the surface-acoustic-wave element electrically and airtightly from an ambience.

The ground patterns are electrically grounded to discharge an electric charge. The ground patterns have sections mounted on a surface of the mounting substrate.

The shut-off member covers the SAW element and also contacts the sections of the grounding patterns.

The shut-off member is preferably applied on the surface-acoustic-wave element so as to cover a second surface opposite to the first surface and also side surfaces of the surface-acoustic-wave element.

In this case, both end-portions of the shut-off member are electrically and mechanically attached to the sections of the grounding patterns mounted on the surface of the mounting substrate.

The shut-off member is preferably formed of a conductive film.

The shut-off member and each of the sections of the ground patterns are preferably connected with each other through a conductive resin member.

The shut-off member and each of the sections of the ground patterns are preferably connected with each other through a conductive adhesive material.

The end portions of the shut-off member are preferably bent inward to connect with the ground pattern.

The end portions of the shut-off member are preferably bent outward to connect with the ground pattern.

A second surface-acoustic-wave device according to the present invention has a surface-acoustic-wave element provided with interdigital electrodes, a shut-off member and ground patterns.

The interdigital electrodes are formed on a first surface of the surface-acoustic-wave element.

The shut-off member serves to shut off the surface-acoustic-wave element electrically and airtightly from an ambience.

The ground patterns are electrically grounded to discharge an electric charge and also have sections mounted on a surface of the mounting substrate.

In this device, the surface-acoustic-wave element is embedded in a recess made in the mounting substrate.

The shut-off member, covering the surface-acoustic-wave element, contacts the sections of the ground patterns mounted on the surface of the mounting substrate.

It is preferable that the mounting substrate is a multiple-layer substrate, and that the recess is a hole opened through a first layer.

In this case, a second surface opposite to the first surface of the surface-acoustic-wave element is arranged to be flush with a surface of the first layer of the multiple-layer substrate.

The shut-off member contacts the sections of the ground patterns in such a manner that the shut-off member covers both the second surface of the surface-acoustic-wave element and the sections mounted on the surface of the first layer of the multiple-layer substrate.

The first and second SAW devices configured as described above enable to perform electrical shielding of the SAW element against an external electric field while designed to be of a low cost and a simple construction as well as a small volume.

The above objects, features and advantages of the present invention will become apparent from the following description referring to the accompanying drawings which illustrate examples of preferred embodiments of the present invention.

DETAILED EXPLANATION OF THE PREFERRED EMBODIMENT

Figure 1:
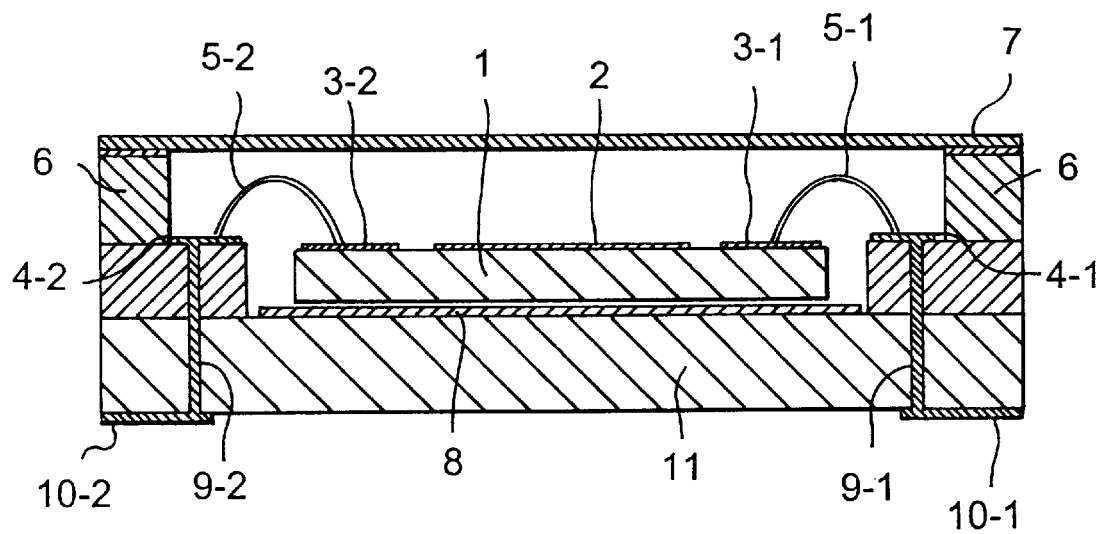
FIG. 1 is a cross-sectional view of a first example of a SAW device currently in use.
Figure 2:
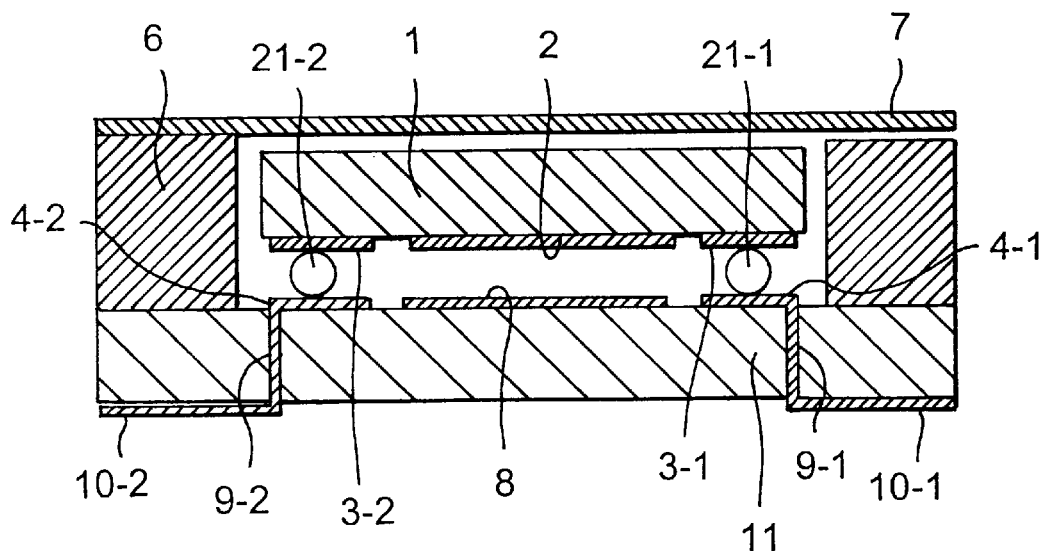
FIG. 2 is a cross-sectional view of a second example of a SAW device currently in use.

Referring to the drawings, the SAW device of the present invention will be set forth below.

Figure 3:
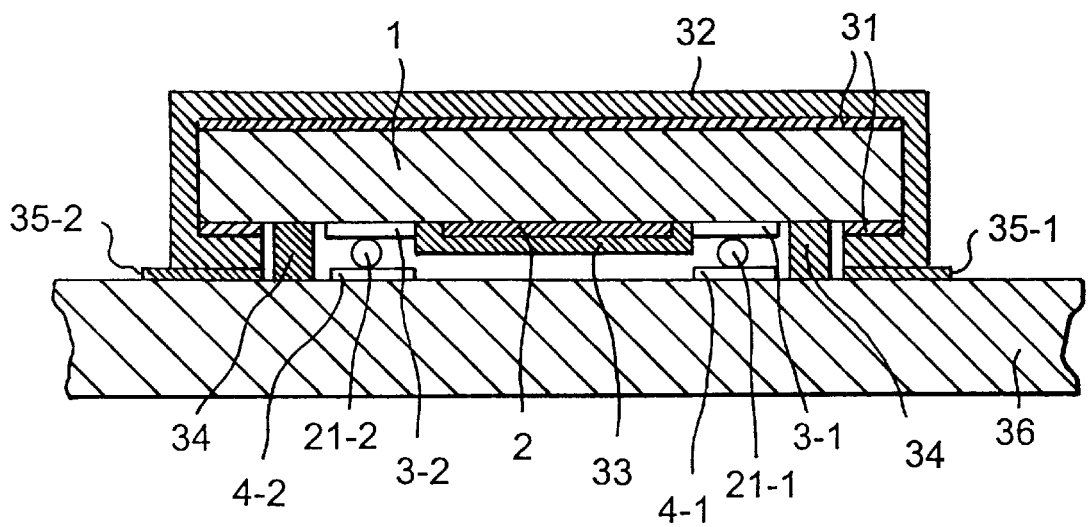
FIG. 3 is a cross-sectional view of a first embodiment of the SAW device according to the present invention illustrating the construction thereof.

FIG. 3 is a cross-sectional view of a first embodiment of the SAW device according to the present invention illustrating the construction thereof.

As is shown in the figure, interdigital electrode 2 and I/O electrodes 3-1, 3-2 are formed of Al thin-films on one of the surfaces, or a first surface, of SAW element 1. (Hereinafter, I/O electrodes 3-1, 3-2 are generically referred to as I/O electrodes 3.)

The end sections of the first surface (the surface provided with interdigital electrodes) and the entire surface of the second surface opposite to the first surface are covered with Al thin-films 31. Furthermore, a sheet of conductive film 32 encloses allover the Al thin-films 31 and side surfaces of SAW element 1.

Interdigital electrode 2 is covered with a protective layer such as $SiO_2$. I/O electrode 3-1 is connected electrically and mechanically with I/O electrode 4-1 by means of metal bump 21-1. Similarly, I/O electrode 3-2 is connected electrically and mechanically with I/O electrode 4-2 by means of metal bump 21-2.

Both ends of conductive film 32 contact ground electrodes 35-1, 35-2 and are connected electrically and mechanically with the electrodes 35-1, 35-2. Conductive film 32 has a thermocrimping property (property of connecting a material with other material under heat and pressure). With the aid of this property, contacts between conductive film 32 and SAW element 1 as well as between conductive film 32 and ground electrode 35-1, 35-2 formed on print substrate 36 can be made at the same time. The contact is carried out using the heat and pressure applied when SAW element 1 is bump-bonded with print substrate 36.

Resin member 34 is formed on SAW element 1 surrounding interdigital electrode 2. The resin member 34 ensures a spacing of SAW element 1 from printing substrate 36. The space enclosed by SAW element 1, print substrate 36 and resin member 34 makes a chamber airtight from the ambience.

Figure 4:
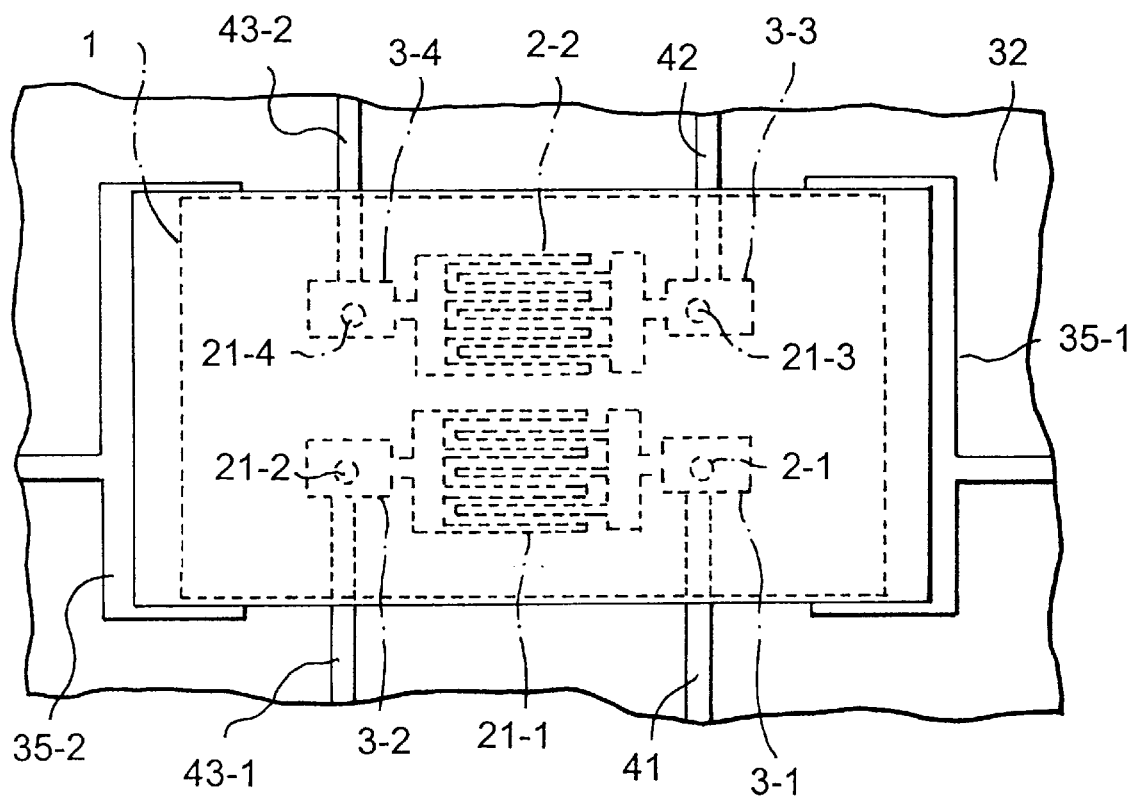
FIG. 4 is a plan view of the SAW device according to the present embodiment as viewed from the topside.

It is to be noted that, while FIG. 3 represents only two of I/O electrodes 3-1, 3-2 and metal bumps 21-1, 21-2, respectively, actually four I/O electrodes and four metal bumps are provided, as is shown in FIG. 4.

In addition, while FIG. 3 represents one interdigital electrode 2, actually two interdigital electrodes are provided.

Next, referring to FIG. 4, the operation of the SAW device shown in FIG. 3 will be explained.

FIG. 4 is a plan view of the SAW device according to the present embodiment as viewed from the topside. In the figure, only interdigital electrodes 2 and I/O electrodes 3 for SAW element 1, metal bumps 21, and the patterns on print substrate 36, i.e., output pattern 41, input pattern 42, ground patterns 42-1, 43-2, are shown in a transparent view by broken lines.

An electric signal applied across input patterns 42 and 43-2 is transferred to I/O electrodes 3-3, 3-4 through metal bumps 21-3, 21-4 and transduced into a SAW at interdigital electrodes 2-2. The SAW, upon reaching interdigital electrodes 2-1, is transduced into an electric signal that appears across I/O electrodes 3-1, 3-2. The electric signal is transferred from I/O electrode 3-1,3-2 to output patterns 41, 43-1 through metal bumps 21-1, 21-2.

The electric characteristics of the output electric signal relative to the input electric signal substantially depend on the shape of interdigital electrodes 2-1, 2-2.

In the above-described embodiment, electrically grounded conductive film 32 covers the entirety of input pattern 42, output pattern 41, I/O electrodes 3-1 through 3-4, metal bump 21-1 through 21-4 and interdigital electrodes 2-1, 2-2. Thus, the conductive film 32 serves to shield the essential part of the device electrically against an external electric field.

The first embodiment described above is summarized as follows:

Since conductive film 32 grounded electrically through ground electrode 35 covers SAW element 1, the present embodiment can offer a SAW device shielded against an external noise field;

Since conductive film 32 is crimped (pressure-connected) and fixed to mounting substrate 36 covering SAW element 1, the strength of combination between conductive film 32 and mounting substrate 36 increases; and Since conductive film 32 can serve as a kind of a protective wall against an external impact, the present embodiment allows relieving an external impact force acting on the SAW device.

Figure 5:
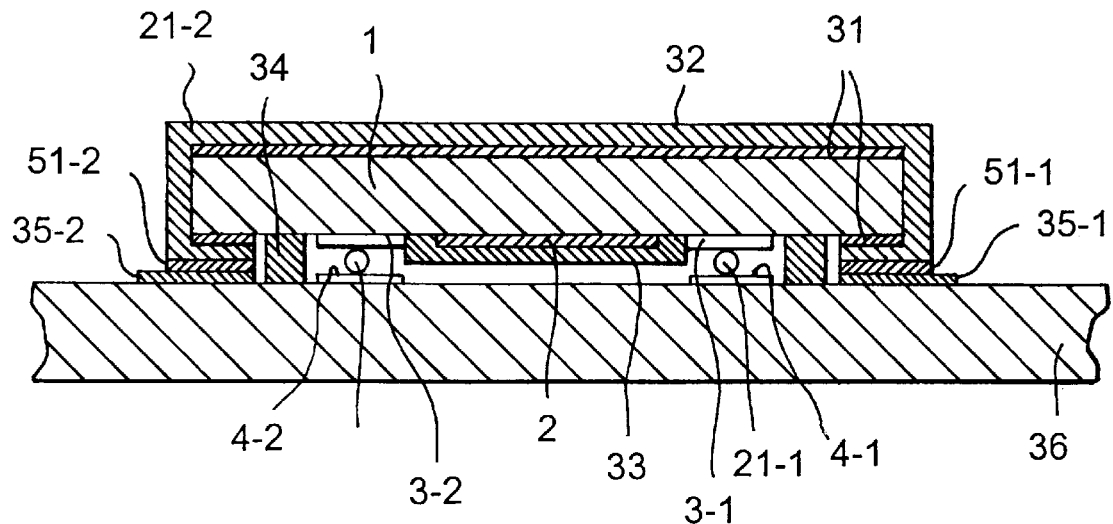
FIG. 5 is a cross-sectional view of the SAW device in the second embodiment.
Figure 6:
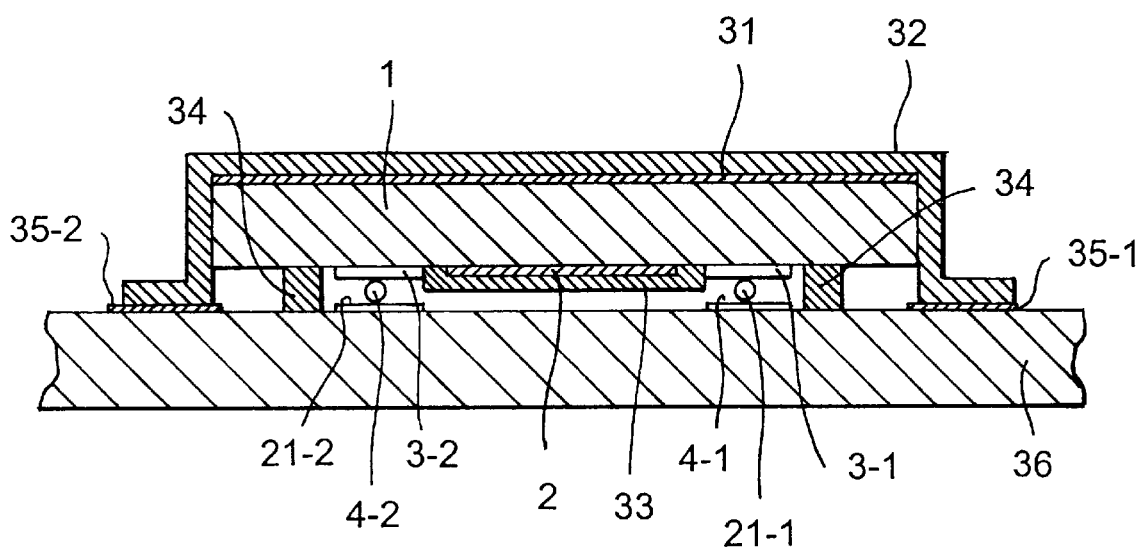
FIG. 6 is a cross-sectional view of the SAW device in the third embodiment.
Figure 7:
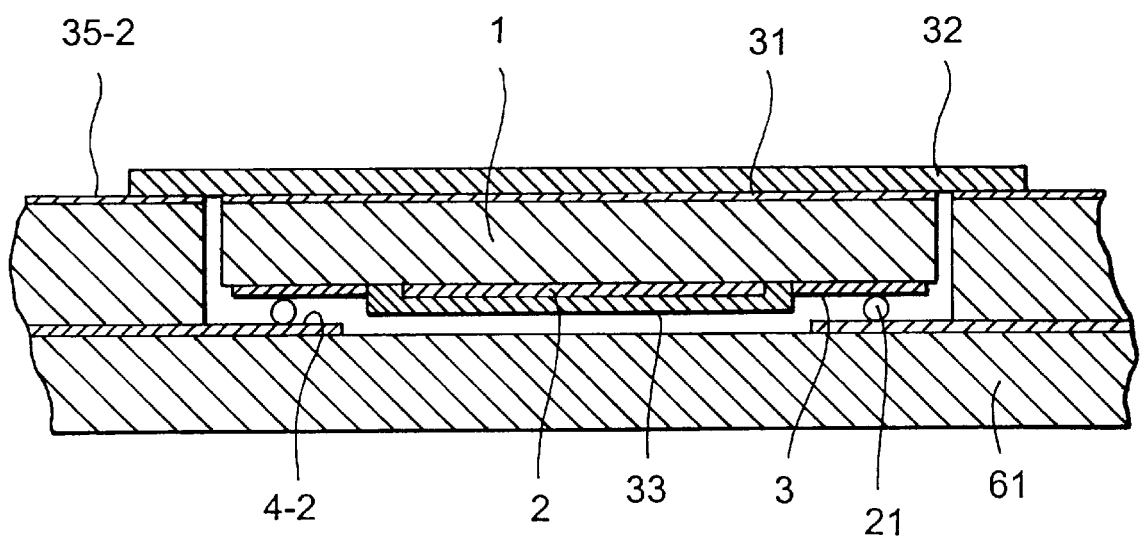
FIG. 7 is a cross-sectional view of the SAW device in the fourth embodiment.

Next, referring to FIG. 5 through FIG. 7, other embodiments will be set forth. In FIGS. 5–7, the same parts as those in FIGS. 3 and 4 are labeled with same reference numbers as denoted in FIGS. 3 and 4.

In the SAW device shown in FIG. 5 (hereinafter, referred to as a second embodiment), conductive resin member 51 is used to combine conductive film 32 with ground electrode 35 provided on the surface of print substrate 51 like the device shown in FIG. 3. Conductive adhesive material may be employed in lieu of conductive resin member 51. Explanation concerning other constituent elements of the device and the operation thereof will be omitted for simplicity, because they are similar to those already set forth with reference to FIG. 3. The SAW device of the second embodiment enables to attain similar technical effects to those of the first embodiment.

In the SAW device shown in FIG. 6 (hereinafter, referred to as a third embodiment), conductive film 32 is bent externally to combine with ground electrode 35 formed, like the device shown in FIG. 3, on the surface of print substrate 51.

Explanation concerning other constituent elements of the device and the operation thereof will be omitted for simplicity, because they are similar to those already set forth with reference to FIG. 3. The SAW device of the third embodiment enables to attain similar technical effects to those of the first embodiment.

FIG. 7 is a cross-sectional view of a fourth embodiment of the present invention.

In this embodiment, multiple-layer print substrate 61 is employed. The first layer of the substrate 61 has a through-hole in which SAW element 1 is received. As a result, the first layer of multiple-layer substrate 61 surrounds SAW element 1. A second surface of SAW element 1, which is opposite to the first surface provided with interdigital electrode 2, is substantially flush with the surface of the substrate 61 on which ground electrodes 35 are formed (the surface of the first layer of the substrate 61).

Conductive film 32 is formed so as to cover both the entirety of the second surface of SAW element 1 and at least a part of ground electrode 35 formed on the surface of the first layer of the substrate 61. In this way, SAW element 1 is shut off electrically and airtightly from ambience.

Explanation concerning other constituent elements of the device and the operation thereof will be omitted for simplicity, because they are similar to those already set forth with reference to FIG. 3. The SAW device thus constructed enables to attain similar technical effects to those of the first embodiment.

Finally, although conductive film 32 is employed in the above-described embodiments, any conductive member may be used in lieu of the conductive film.

It is to be understood, however, that although the characteristics and advantages of the present invention have been set forth in the foregoing description, the disclosure is illustrative only, and changes may be made in the shape, size, and arrangement of the parts within the scope of the appended claims.

What is claimed is:

1. A surface-acoustic-wave device having a surface-acoustic-wave element with interdigital electrodes formed on a first surface, said surface-acoustic-wave element being mounted on a mounting substrate, said surface-acoustic-wave device including a conductive film for electrically and airtightly shielding off said surface-acoustic-wave element from an external noise field and ambience, and grounding means electrically grounded for discharging an electric charge, said grounding means having sections provided on a surface of said mounting substrate, said conductive film covering said surface-acoustic-wave element and being in contact with a second surface opposite to said first surface and side surfaces of said surface-acoustic-wave element, said conductive film having end-portions that are electrically and mechanically attached to said sections of said grounding means provided on said mounting substrate.

2. A device as claimed in claim 1, wherein said conductive film has a thermocrimping property and is made to contact with said second surface and side surfaces of said surface-acoustic-wave element using heat and pressure.

3. A device as claimed in claim 1, wherein said conductive film and each of said sections of said grounding means are connected with each other through a conductive resin member.

4. A device as claimed in claim 1, wherein said conductive film and said sections of said grounding means are connected with each other through a conductive adhesive material.

5. A device as claimed in claim 1, wherein said end portions of said conductive film are bent inward to be connected with sections of said grounding means.

6. A device as claimed in claim 1, wherein said end portions of said conductive film are bent outward to be connected with said sections of said grounding means.

7. A device as claimed in claim 1, wherein said interdigital electrodes are covered with a protective layer to protect the interdigital electrodes from corrosion.

8. A surface-acoustic-wave device having a surface-acoustic-wave element with interdigital electrodes formed on a first surface, said surface-acoustic-wave element being mounted on a mounting substrate, said surface-acoustic-wave device including a conductive film for electrically and airtightly shielding off said surface-acoustic-wave element from an external noise field and ambience, and grounding means electrically grounded for discharging an electric charge, said grounding means having sections provided on a surface of said mounting substrate, said mounting substrate is a multiple-layer substrate having a first layer provided with a through-hole, said surface-acoustic-wave element is embedded in the through-hole with a second surface thereof arranged to be flush with a surface of said multiple-layer substrate, said second surface being a surface opposite to said first surface, and said conductive film contacts said section of said grounding means in such a manner that said conductive film contacts both said second surface of said surface-acoustic-wave element and said sections provided on said surface of said multiple-layer substrate.

* * * * *